United States Patent
Wu et al.

(10) Patent No.: US 7,776,713 B2
(45) Date of Patent: Aug. 17, 2010

(54) ETCHING SOLUTION, METHOD OF SURFACE MODIFICATION OF SEMICONDUCTOR SUBSTRATE AND METHOD OF FORMING SHALLOW TRENCH ISOLATION

(75) Inventors: Chia-Wei Wu, Hsinchu (TW); Jung-Yu Shieh, Hsinchu (TW); Ling-Wu Yang, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 400 days.

(21) Appl. No.: 11/806,186

(22) Filed: May 30, 2007

(65) Prior Publication Data

US 2008/0299741 A1  Dec. 4, 2008

(51) Int. Cl.
*H01L 21/465* (2006.01)
(52) U.S. Cl. ............... 438/435; 438/745; 257/E21.485
(58) Field of Classification Search ........... 257/E21.485
See application file for complete search history.

(56) References Cited

U.S. PATENT DOCUMENTS

| 5,302,311 A | | 4/1994 | Sugihara et al. | |
|---|---|---|---|---|
| 5,454,901 A | | 10/1995 | Tsuji | |
| 5,741,740 A | * | 4/1998 | Jang et al. | 438/435 |
| 5,919,311 A | * | 7/1999 | Shive et al. | 134/1 |
| 2002/0052121 A1 | * | 5/2002 | Lee et al. | 438/745 |
| 2003/0045119 A1 | * | 3/2003 | Wang et al. | 438/745 |
| 2006/0046487 A1 | * | 3/2006 | Miyazaki et al. | 438/689 |

FOREIGN PATENT DOCUMENTS

CN     1734722 A     2/2006

* cited by examiner

*Primary Examiner*—Stephen W Smoot
(74) *Attorney, Agent, or Firm*—Birch, Stewart, Kolasch & Birch, LLP

(57) ABSTRACT

An etching solution, a method of surface modification of a semiconductor substrate and a method of forming shallow trench isolation are provided. The etching solution is used for surface modifying the semiconductor substrate. The etching solution includes an oxidant and an oxide remover. The semiconductor substrate is oxidized to a semiconductor oxide by the oxidant, and the oxide remover subtracts the semiconductor oxide.

16 Claims, 5 Drawing Sheets

ETCHING SOLUTION, METHOD OF SURFACE MODIFICATION OF SEMICONDUCTOR SUBSTRATE AND METHOD OF FORMING SHALLOW TRENCH ISOLATION

BACKGROUND OF THE INVENTION

1. Field of the Invention

The invention relates in general to an etching solution, a method of surface modification of a semiconductor substrate and a method of forming shallow trench isolation, and more particularly to an etching solution, a method of surface modification of a semiconductor substrate and a method of forming shallow trench isolation applied to a silicon substrate.

2. Description of the Related Art

As the scale of integrated circuits decreases, the isolation process between the semiconductor devices to avoid current leakage or short circuit becomes more and more important. Conventionally, a local oxidation of silicon (LOCOS) isolation method is introduced to isolate semiconductor devices. The LOCOS isolation method mainly includes following steps. First, a pad oxide layer and a pad nitride layer are formed on a silicon chip. Next, the pad oxide layer and the pad nitride layer are etched to expose a part of the silicon chip. Then, a field oxide layer of silicon dioxide is formed by thermal oxidation. However, the silicon located on the edges of the pad oxide layer and the pad nitride layer is also oxidized to silicon dioxide by oxygen and moisture while forming the field oxide layer in the thermal oxidation process. The silicon dioxide on the edges is warped and forms "bird's beak," which reduces the length of the active region. When the scale of semiconductor devices further decreases, the length of "bird's beak" affects the active region more significantly. As a result, the following manufacturing processes of the semiconductor device are affected seriously.

Therefore, a shallow trench isolation (STI) technology is developed recently. A trench is etched on a silicon chip first, and then silicon dioxide is filled in the trench for forming isolation between semiconductor devices. The pad oxide layer and the pad nitride layer are used as a mask layer while etching the trench. After the trench filling step and a planarization step, the mask layer is removed. However, when the mask layer is removed by wet etching, the etchant erodes the silicon or polysilicon of the silicon chip and damages the surface of the silicon chip. Additionally, after the mask layer is removed, nitride residuals on the silicon chip damage the surface of the silicon chip as well and lower the yield rate accordingly.

In order to avoid the so called "kooi effect" mentioned above and the accompanying white ribbon phenomenon, a method of utilizing a sacrificial oxide layer is developed. In general, the surface of the silicon chip is oxidized to from the sacrificial oxide layer. Then, the sacrificial oxide layer is removed for improving the surface quality of the silicon chip. However, the overall manufacturing time and steps are increased. Besides that, a shallow trench isolation technology without the pad nitride layer is developed to avoid the problems caused by wet etching the pad nitride layer. Nevertheless, other problems are brought up in this manner, e.g. the manufacturing process gets more complicated, the process step increases significantly, and the manufacturing cost is increased.

Therefore, there exists a requirement of solving the above problems without complicating the manufacturing process and increasing the cost.

SUMMARY OF THE INVENTION

The invention is directed to an etching solution, a method of surface modification of a semiconductor substrate and a method of forming shallow trench isolation. The etching solution includes an oxidant and an oxide remover. The surface of the semiconductor substrate is directly exposed to the etching solution for surface modification. Accordingly, the surface quality of the semiconductor substrate is improved, and the kooi effect is alleviated. Furthermore, the steps are easy to perform, and the manufacturing cost is reduced.

According to a first aspect of the present invention, an etching solution for surface modifying a semiconductor substrate is provided. The etching solution includes an oxidant and an oxide remover. The oxidant is for oxidizing the semiconductor substrate to a semiconductor oxide. The oxide remover is for removing the semiconductor oxide.

According to a second aspect of the present invention, a method of surface modification of a semiconductor substrate is provided. First, a semiconductor substrate is provided. Next, the semiconductor substrate is exposed to an etching solution including an oxidant and an oxide remover.

According to a third aspect of the present invention, a method of forming shallow trench isolation is provided. First, a semiconductor substrate with a trench is provided. Then, a liner layer is formed on the surface of the trench. Afterwards, a dielectric material is filled in the trench. Subsequently, the semiconductor substrate is exposed to an etching solution for surface modifying the semiconductor substrate. The etching solution includes an oxidant and an oxide remover.

The invention will become apparent from the following detailed description of the preferred but non-limiting embodiment. The following description is made with reference to the accompanying drawings.

DETAILED DESCRIPTION OF THE INVENTION

Figure 1:
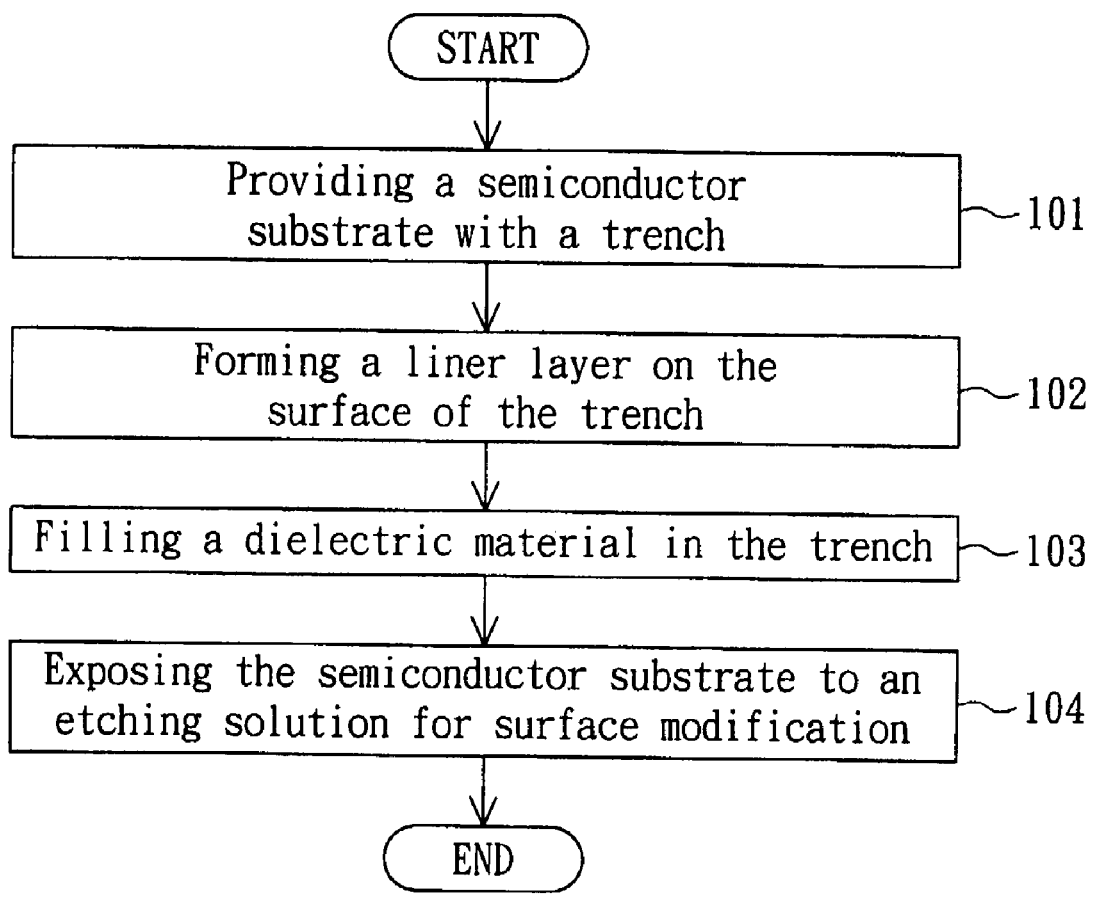
FIG. 1 is a flow chart of a method of forming shallow trench isolation according to a preferred embodiment of the present invention.

A preferred embodiment is provided as follow to illustrate the present invention. However, the present invention is not limited thereto. Furthermore, unnecessary components are not shown in the drawings of the embodiment for clarity.

Please refer to FIG. 1. FIG. 1 is a flow chart of a method of forming shallow trench isolation according to a preferred embodiment of the present invention. The method mainly includes the following steps. First, a semiconductor with a trench is provided. Next, a liner layer is formed on the surface of the trench. Then, a dielectric material is filled in the trench. Afterwards, the semiconductor substrate is exposed to an etching solution for surface modification to improve the surface quality of the semiconductor substrate, and to avoid kooi effect.

The method is further exemplified by forming shallow trench isolation at a silicon substrate in the following description. However, any one who is skilled in the technology of the invention will understand that the invention can be used in any semiconductor devices to reform the surface quality, such that the performance of the semiconductor device is further improved.

Figure 2A:
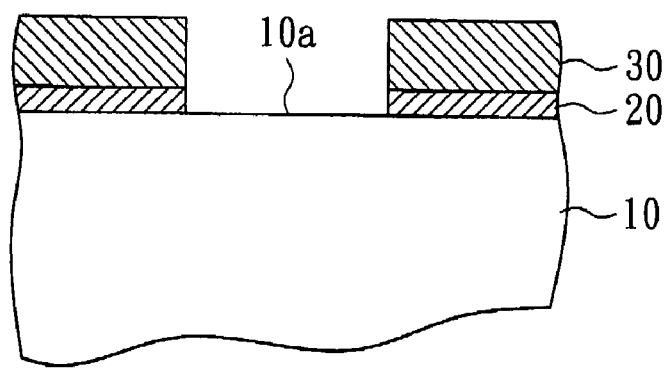
FIG. 2A illustrates a substrate, a buffer layer and a mask layer according to the preferred embodiment of the present invention.
Figure 2B:
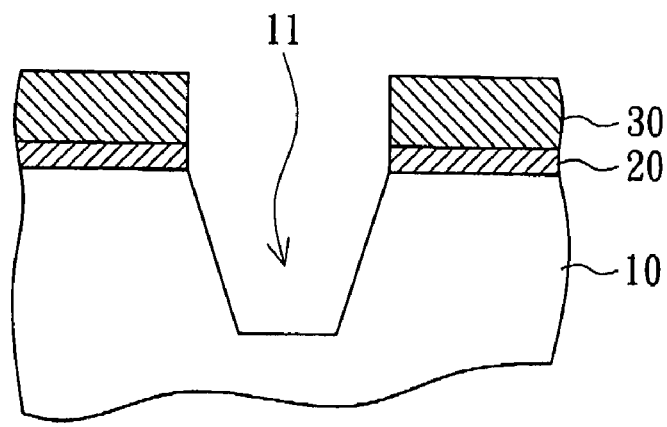
FIG. 2B illustrates a trench formed on the substrate in FIG. 2A.
Figure 2C:
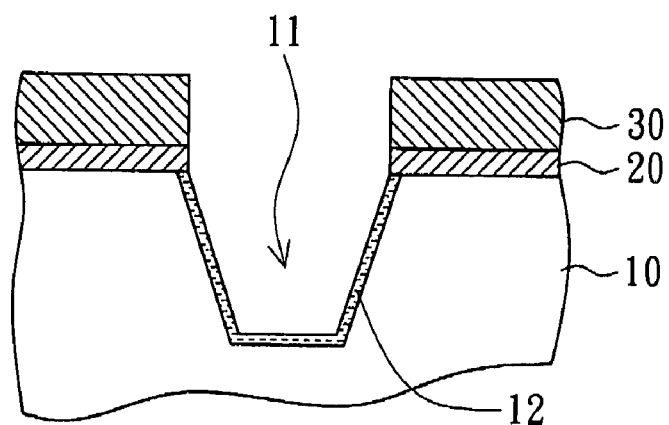
FIG. 2C illustrates a liner layer formed on the surface of the trench in FIG. 2B.
Figure 2D:
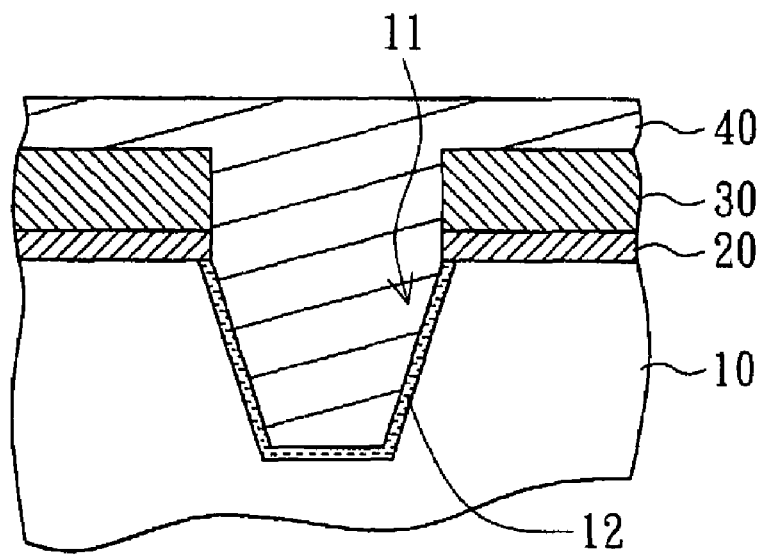
FIG. 2D illustrates a dielectric material deposited in the trench and on the mask layer in FIG. 2C.
Figure 2E:
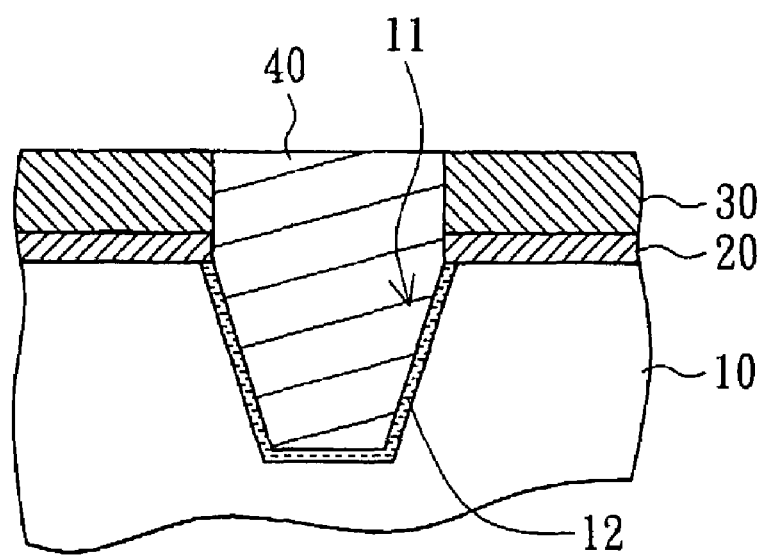
FIG. 2E illustrates the dielectric material and the mask layer in FIG. 2D after a planarization step.
Figure 2F:
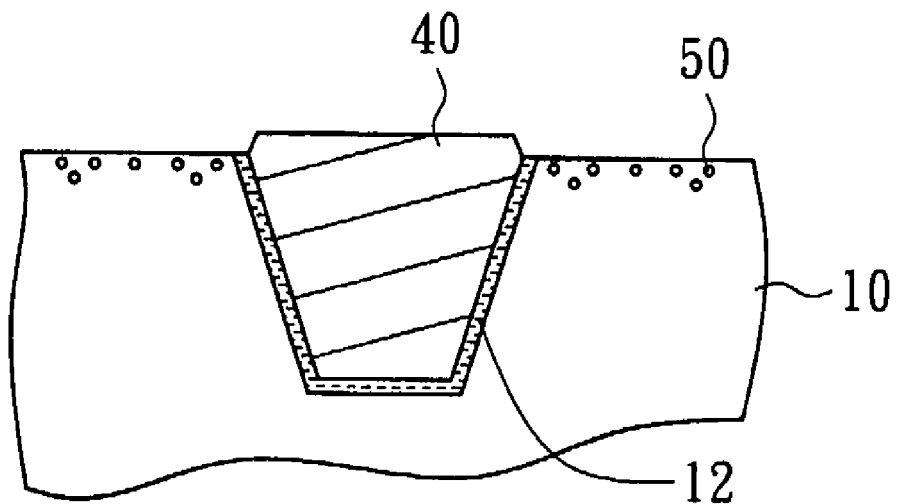
FIG. 2F illustrates the substrate in FIG. 2E after the mask layer and the buffer layer are removed.
Figure 2G:
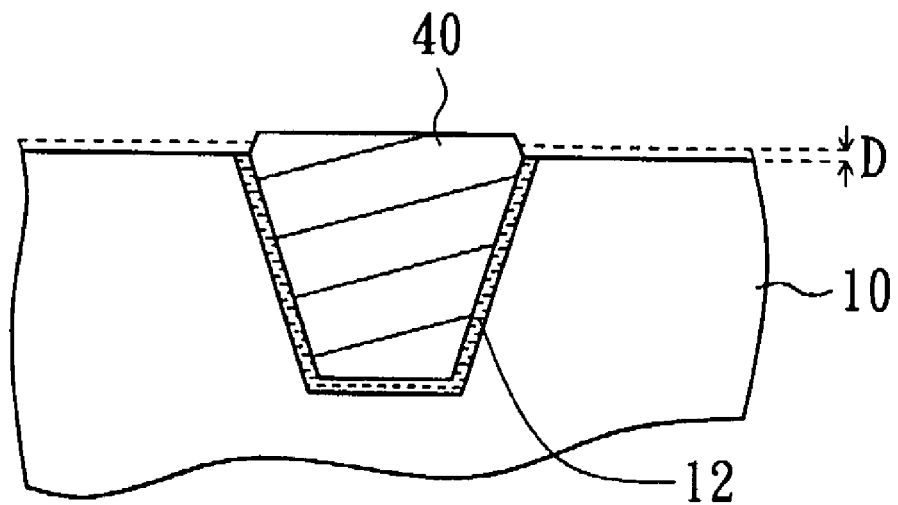
FIG. 2G illustrates the substrate in FIG. 2F after surface modification.

Referring to FIG. 2A~2G at the same time; FIG. 2A illustrates a substrate, a buffer layer and a mask layer according to the preferred embodiment of the present invention. FIG. 2B illustrates a trench formed on the substrate in FIG. 2A. FIG. 2C illustrates a liner layer formed on the surface of the trench in FIG. 2B. FIG. 2D illustrates a dielectric material deposited in the trench and on the mask layer in FIG. 2C. FIG. 2E illustrates the dielectric material and the mask layer in FIG. 2D after a planarization step. FIG. 2F illustrates the substrate in FIG. 2E after the mask layer and the buffer layer are removed. FIG. 2G illustrates the substrate in FIG. 2F after surface modification.

First, in step 101 in FIG. 1, a semiconductor substrate with a trench is provided. The trench is formed through the following steps. As shown in FIG. 2A, a buffer layer 20 and a mask layer 30 are sequentially disposed on a surface 10a of the semiconductor substrate 10. The buffer layer 20 and the mask layer 30 have the same pattern. In the present embodiment, the mask layer 30 is a nitride layer, and the buffer layer 20 is an oxide layer as an example. The buffer layer 20 is for alleviating the stress when the mask layer 30 is attached on the semiconductor substrate 10. Next, part of the semiconductor substrate 10 that is not corresponding to the pattern is etched to form the trench 11, as shown in FIG. 2B.

Then, in step 102, a liner layer 12 is formed on the surface of the trench 11, as shown in FIG. 2C. In the present embodiment, the liner layer 12 is formed through a high temperature oxidation process for example. In this process, the surface of the trench 11 is oxidized at a temperature around 900° C. to 1000° C.

Afterwards, in step 103, a dielectric material is filled in the trench 11. The dielectric material 40 is deposited in the entire trench 11. In the present embodiment, the dielectric material 40 is made of silicon dioxide ($SiO_2$) as an example and preferably deposited in the trench 11 and on the mask layer 30 through chemical vapor deposition (CVD), as shown in FIG. 2D. Moreover, after the dielectric material 40 is deposited, the dielectric property of the dielectric material 40 is improved through high temperature annealing. Thereon, the dielectric material 40 is planarized to the surface of the mask layer 30 through chemical mechanical polishing, as shown in FIG. 2E.

Later, the buffer layer 20 and the mask layer 30 are removed to expose the semiconductor layer 10, as shown in FIG. 2F. In the present embodiment, the mask layer 30 is made of nitride (such as silicon nitride). Also, the buffer layer 20 and the mask layer 30 are preferably removed through wet etching. After the buffer layer 20 and the mask layer 30 are removed, nitride 50 remains adjacent to the surface of the semiconductor substrate 10.

Then, in step 104, the semiconductor substrate 10 is exposed to an etching solution for surface modifying the semiconductor substrate 10. The semiconductor substrate 10 is removed by a thickness D through the etching solution, as shown in FIG. 2G. The thickness D is about 15~50 angstroms. The surface quality of the semiconductor substrate 10 is maintained after the etching step.

The etching solution includes an oxidant and an oxide remover. The oxidant is for oxidizing the semiconductor substrate 10 to a semiconductor oxide. The oxide remover is for removing the semiconductor oxide. Accordingly, the semiconductor substrate 10 is removed by the thickness D. In the present embodiment, the oxidant includes hydrogen peroxide ($H_2O_2$), and the oxide remover includes ammonium hydroxide ($NH_4OH$) as an example. The etching solution further includes de-ionized water. The volume proportion of the oxide remover is greater than that of the oxidant. Generally speaking, the volume proportion of the oxide remover, the oxidant and the de-ionized water is about 2~4:1:80~200. Preferably, the volume proportion of the oxide remover, the oxidant and the de-ionized water is about 4:1:110. Also, the semiconductor substrate 10 is exposed to the etching solution for about six minutes at the temperature of 25° C. for removing by the thickness D. In another example, the oxide remover includes hydrogen fluoride (HF). The volume proportion of the oxide remover, the oxidant and the de-ionized water is about 1:2:500. Also, the semiconductor substrate 10 is exposed to the etching solution for about 20 minutes at the temperature around 30° C. for removing by the thickness D.

In the present embodiment of the invention, the etching solution includes ammonium hydroxide ($NH_4OH$), hydrogen peroxide ($H_2O_2$) and de-ionized water as an example, and includes hydrogen fluoride (HF), hydrogen peroxide ($H_2O_2$) and de-ionized water as another example. However, any one who has ordinary skills in the field of the invention can understand that the present invention is not limited thereto. The etching solution can be any other solution that is capable of etching the semiconductor substrate 10 (such as hydrogen fluoride with ozone water solution). Therefore, by applying the etching solution, the surface quality of the semiconductor substrate is improved after shallow trench isolation is formed.

Figure 3A:
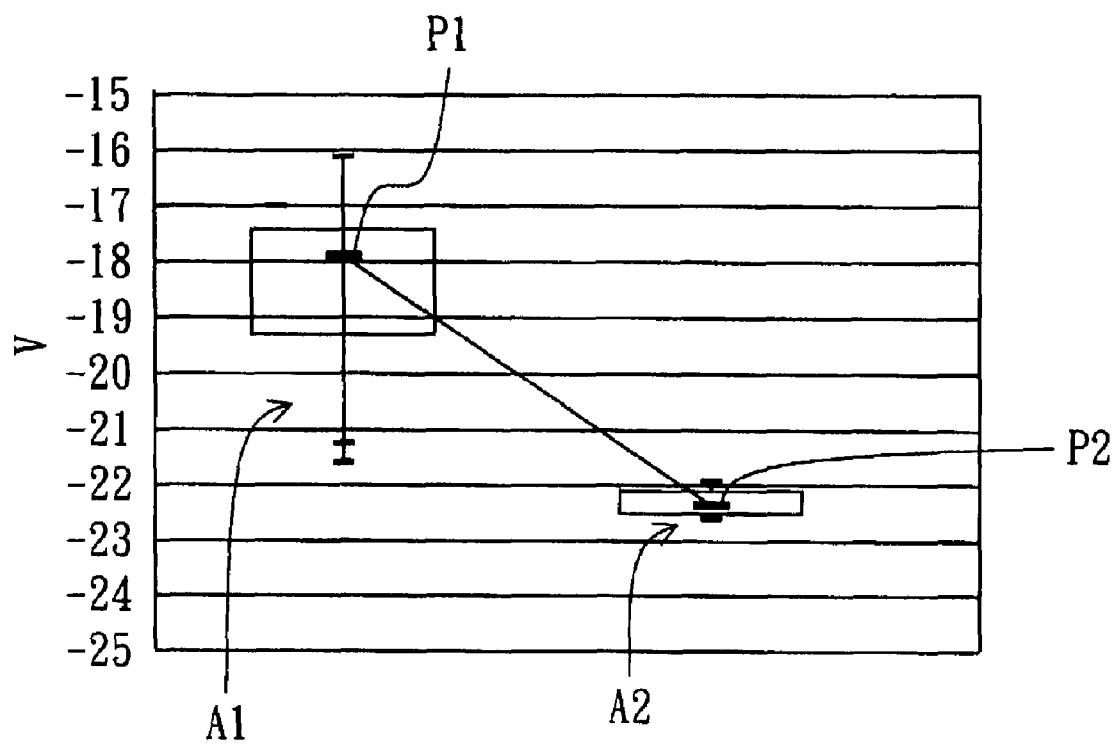
FIG. 3A shows the distribution of the threshold voltage of the PMOS device before and after performing the method of forming shallow trench isolation according to the preferred embodiment of the present invention.
Figure 3B:
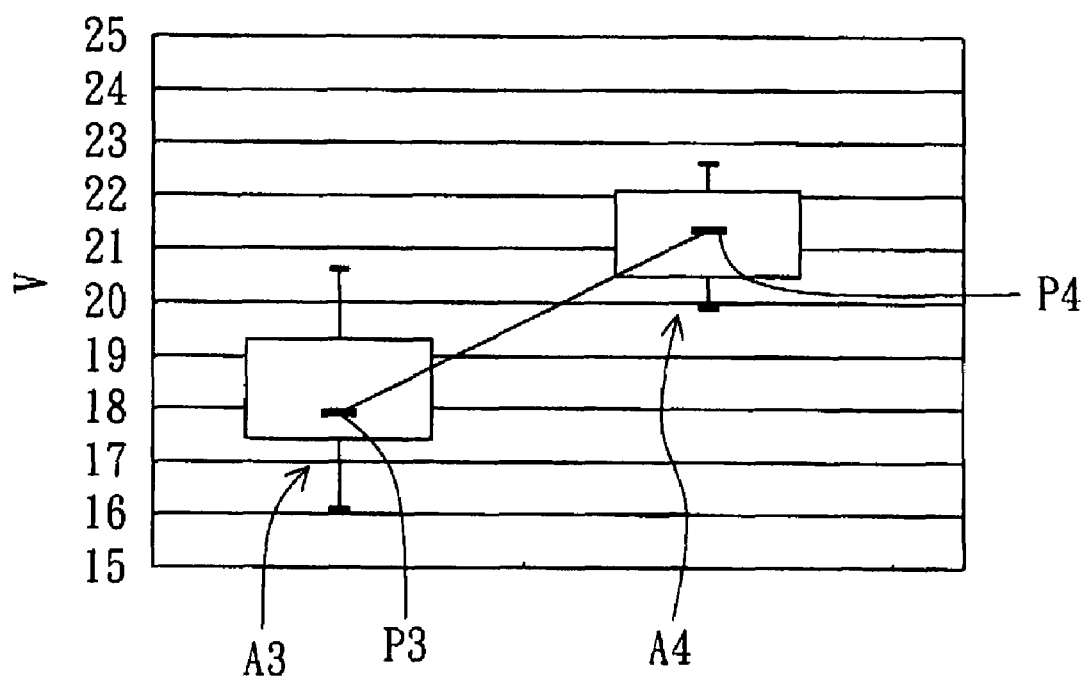
FIG. 3B shows the distribution of the threshold voltage of the NMOS device before and after performing the method of forming shallow trench isolation according to the preferred embodiment of the present invention.

The method of forming shallow trench isolation of the present invention is applied in the manufacturing process of a semiconductor device as an example. The threshold voltage of the semiconductor device is measured before and after the method of forming shallow trench isolation of the present invention is performed. The semiconductor device is a PMOS device or a NMOS device for example. Please referring to FIG. 3A, the distribution of the threshold voltage of the PMOS device before and after performing the method of forming shallow trench isolation according to the preferred embodiment of the present invention is illustrated. A first voltage range A1 shows the distribution of the threshold voltage of the PMOS device without performing the method of the present embodiment. A second voltage range A2 shows the threshold voltage of the PMOS device that adopts the method of the present embodiment. As shown in FIG. 3A, the second voltage range A2 is smaller than the first voltage range A1. In other words, the distribution of the threshold voltage is reduced effectively after adopting the method of forming shallow trench isolation according to the present embodiment. Furthermore, as the average value P1 of the first voltage range A1 and the average value P2 of the second voltage range A2 show, the PMOS device that adopts the method of the present embodiment has larger negative threshold voltage. Please referring to FIG. 3B, the distribution of the threshold voltage of the NMOS device before and after performing the method of forming shallow trench isolation according to the preferred embodiment of the present invention is illustrated. A third voltage range A3 shows the distribution of the threshold voltage of the NMOS device without performing the method of the present embodiment. A fourth voltage range A4 shows the distribution of the threshold voltage of the NMOS device that adopts the method of the present embodiment. As shown in FIG. 3B, the fourth voltage range A4 is smaller than the third voltage range A3. As the average value P3 of the third voltage range A3 and the average value P4 of the fourth voltage range A4 show, the NMOS device that adopts the method of forming shallow trench isolation according to the present embodiment has larger positive threshold voltage. In general, the method of forming shallow trench isolation according to the preferred embodiment of the present invention reduces the distribution of the threshold voltage of the PMOS device and the NMOS device. The operation stability of the PMOS device and the NMOS device is improved relatively. Furthermore, the problems in accordance with threshold voltage drop are avoided, and the quality of the PMOS device and the NMOS device is increased.

In the etching solution, the method of surface modification of a semiconductor substrate and a method of forming shallow trench isolation according to the preferred embodiment of the present invention, the semiconductor substrate is removed by a thickness through the etching solution that includes the oxidant and the oxide remover. The nitride remainings adjacent to the surface of the semiconductor substrate are removed, so as to improve the surface quality of the semiconductor substrate and to avoid kooi effect. Furthermore, the method has a virtue of simple process steps, that is, simply exposing the surface of the semiconductor substrate to the etching solution for etching the semiconductor substrate. Also, the ingredients of the etching solution are industrial standardized and very easy to obtain, therefore the cost is relatively low, and the overall manufacturing cost is lowered accordingly.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of surface modification of a semiconductor substrate, the method comprising:
   providing a semiconductor substrate;
   forming a buffer layer and a mask layer on the semiconductor substrate;
   removing the buffer layer and the mask layer, wherein at least a nitride remains adjacent to a surface of the semiconductor substrate; and
   exposing the semiconductor substrate to an etching solution comprising an oxidant and an oxide remover for removing the nitride.

2. The method according to claim 1, wherein the volume proportion of the oxide remover is greater than that of the oxidant.

3. The method according to claim 2, wherein the oxidant comprises hydrogen peroxide ($H_2O_2$), the oxide remover comprising ammonium hydroxide ($NH_4OH$), the etching solution further comprising de-ionized water,
   wherein the volume proportion of the oxide remover, the oxidant and the de-ionized water is substantially 2~4:1: 80~200.

4. The method according to claim 2, wherein the oxidant comprises hydrogen peroxide ($H_2O_2$), the oxide remover comprising ammonium hydroxide ($NH_4OH$), the etching solution further comprising de-ionized water,
   wherein the volume proportion of the oxide remover, the oxidant and the de-ionized water is substantially 4:1: 110.

5. The method according to claim 1, wherein the oxidant comprises hydrogen peroxide, and the oxide remover comprises hydrogen fluoride.

6. A method of forming shallow trench isolation (STI), the method comprising:
   providing a semiconductor substrate with a buffer layer, a mask layer and a trench formed on the semiconductor substrate;
   forming a liner layer on the surface of the trench;
   filling a dielectric material in the trench;
   removing the buffer layer and the mask layer, wherein at least a nitride remains adjacent to a surface of the semiconductor substrate; and
   exposing the semiconductor substrate to an etching solution for surface modification and for removing the nitride, the etching solution comprising an oxidant and an oxide remover.

7. The method according to claim 6, wherein the volume proportion of the oxide remover greater than that of the oxidant.

8. The method according to claim 7, wherein the oxidant comprises hydrogen peroxide ($H_2O_2$), the oxide remover comprising ammonium hydroxide ($NH_4OH$), the etching solution further comprising de-ionized water,
   wherein the volume proportion of the oxide remover, the oxidant and the de-ionized water is substantially 2~4:1: 80~200.

9. The method according to claim 7, wherein the oxidant comprises hydrogen peroxide ($H_2O_2$), the oxide remover comprising ammonium hydroxide ($NH_4OH$), the etching solution further comprising de-ionized water,
   wherein the volume proportion of the oxide remover, the oxidant and the de-ionized water is substantially 4:1: 110.

10. The method according to claim 6, wherein the oxidant comprises hydrogen peroxide, and the oxide remover comprises hydrogen fluoride.

11. The method according to claim 6, wherein the liner layer is formed by oxidizing the semiconductor substrate at a temperature approximately 900° C. to 1000° C.

12. The method according to claim 6, wherein the dielectric material is filled in the trench through chemical vapor deposition (CVD).

13. The method according to claim 6, wherein the buffer layer and the mask layer are formed on a surface of the semiconductor substrate with a pattern, the step of providing the semiconductor substrate further comprising:
   etching part of the semiconductor substrate which is not corresponding to the pattern to form the trench.

14. The method according to claim 13, wherein the step of filling the dielectric material further comprises:
   depositing the dielectric material in the trench and on the mask layer; and
   planarizing the dielectric material and the mask layer.

15. The method according to claim 13, wherein the step of removing the buffer layer and the mask layer is performed through wet etching.

16. The method according to claim 13, wherein the buffer layer is an oxide layer, and the mask layer is a nitride layer.

* * * * *